United States Patent
Huang et al.

(10) Patent No.: US 6,785,109 B1
(45) Date of Patent: Aug. 31, 2004

(54) TECHNIQUE FOR PROTECTING INTEGRATED CIRCUIT DEVICES AGAINST ELECTROSTATIC DISCHARGE DAMAGE

(75) Inventors: Cheng H. Huang, Cupertino, CA (US); Chiakang Sung, Milpitas, CA (US); John Costello, San Jose, CA (US)

(73) Assignee: Altera Corporation, San Jose, CA (US)

( * ) Notice: Subject to any disclaimer, the term of this patent is extended or adjusted under 35 U.S.C. 154(b) by 157 days.

(21) Appl. No.: 09/756,501

(22) Filed: Jan. 8, 2001

Related U.S. Application Data

(60) Provisional application No. 60/175,201, filed on Jan. 10, 2000.

(51) Int. Cl.$^7$ ................................................ H02H 3/22
(52) U.S. Cl. ........................................ 361/111; 361/56
(58) Field of Search ............ 361/56, 111; 257/355–360

(56) References Cited

U.S. PATENT DOCUMENTS

| | | | |
|---|---|---|---|
| 5,157,573 A | 10/1992 | Lee et al. ...................... 361/56 |
| 5,706,156 A | * 1/1998 | Narita .......................... 361/56 |
| 5,721,656 A | * 2/1998 | Wu et al. ...................... 361/56 |
| 5,973,901 A | * 10/1999 | Narita et al. ................. 361/111 |
| 6,091,595 A | 7/2000 | Sharpe-Geisler ............ 361/111 |
| 6,097,071 A | 8/2000 | Krakauer ..................... 257/395 |

OTHER PUBLICATIONS

J. Millman and H. Taub, *Pulse, Digital, and Switching Waveforms: Devices and circuits for their generation and processing*, McGraw–Hill Book Co., New York, 1965, pp. 198–203.

K. Narita, Y. Horiguchi, T. Fujii, and K. Nakamura, "A Novel On–Chip Electrostatic Discharge (ESD) Protection with Common Discharge Line for High–Speed CMOS LSI's", IEEE Transactions on Electron Devices, vol. 44, No. 7, Jul. 1997, pp. 1124–1130.

* cited by examiner

*Primary Examiner*—Kim Huynh
(74) *Attorney, Agent, or Firm*—Fish & Neave; Robert R. Jackson

(57) ABSTRACT

A technique for providing ESD protection for integrated circuit devices with multiple power and/or ground buses is provided. The technique involves using a clamping device that is capable of handling both positive and negative ESD pulses to clamp each power bus, ground bus, and I/O pad within a device to a respective one of the ground buses. Without resorting to exhaustive cross-clamping, this arrangement provides a discharge path for an ESD pulse applied across any combination of power buses, ground buses, and I/O pads during an ESD event.

23 Claims, 3 Drawing Sheets

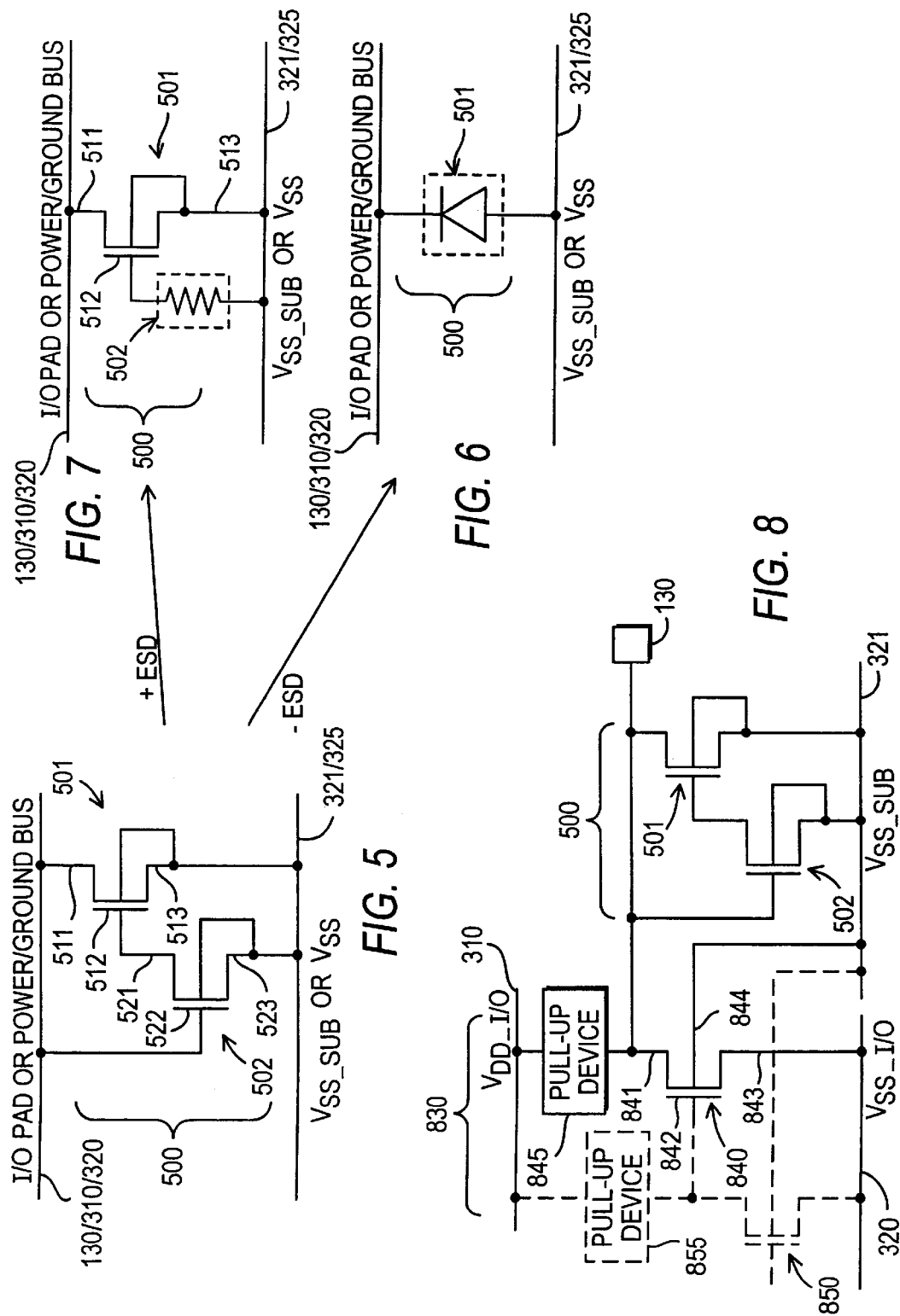

TECHNIQUE FOR PROTECTING INTEGRATED CIRCUIT DEVICES AGAINST ELECTROSTATIC DISCHARGE DAMAGE

CROSS REFERENCE TO RELATED APPLICATION

This claims the benefit of U.S. Provisional Patent Application No. 60/175,201, filed Jan. 10, 2000.

BACKGROUND OF THE INVENTION

This invention relates to integrated circuit devices, and more particularly to a technique for protecting such devices against electrostatic discharge (ESD) damage.

As the number of power and/or ground buses within a device increases, achieving effective ESD protection of that device becomes more difficult. Conventional solutions for handling ESD between multiple power and/or ground buses often involve clamping an ESD protection circuit between each combination of power and ground buses. Such exhaustive cross-clamping soon becomes difficult, if not impractical, as the number of power and/or ground buses increases. Similarly, for the input/output (I/O) circuitry, applying conventional ESD protection techniques such as using large I/O transistors and/or providing complex ESD protection circuits for each I/O pad may become unwieldy as the number of power and/or ground buses increases.

SUMMARY OF THE INVENTION

The present invention relates to an improved technique for providing ESD protection for integrated circuit devices with multiple power and/or ground buses. The technique involves clamping each power bus, ground bus, and I/O pad within a device to a respective one of the ground buses. In accordance with the principles of the present invention, this arrangement provides a discharge path between any power bus, ground bus, and I/O pad during an ESD event without resorting to exhaustive cross-clamping. Moreover, this technique simplifies the I/O protection circuitry, thereby saving chip area and decreasing I/O capacitance.

Further features of the invention, its nature and various advantages will be more apparent from the accompanying drawings and the following detailed description of the invention.

BRIEF DESCRIPTION OF THE DRAWINGS

FIG. 5 shows one embodiment of a circuit which may be used for the purposes of the present invention.

FIG. 6 is a simplified block diagram that illustrates a first operating mode of the circuit of FIG. 5.

FIG. 7 is a simplified block diagram that illustrates a second operating mode of the circuit of FIG. 5.

FIG. 8 is a simplified illustration of an aspect of the invention as applied to an output driver.

DETAILED DESCRIPTION OF THE INVENTION

Figures 1, 2:
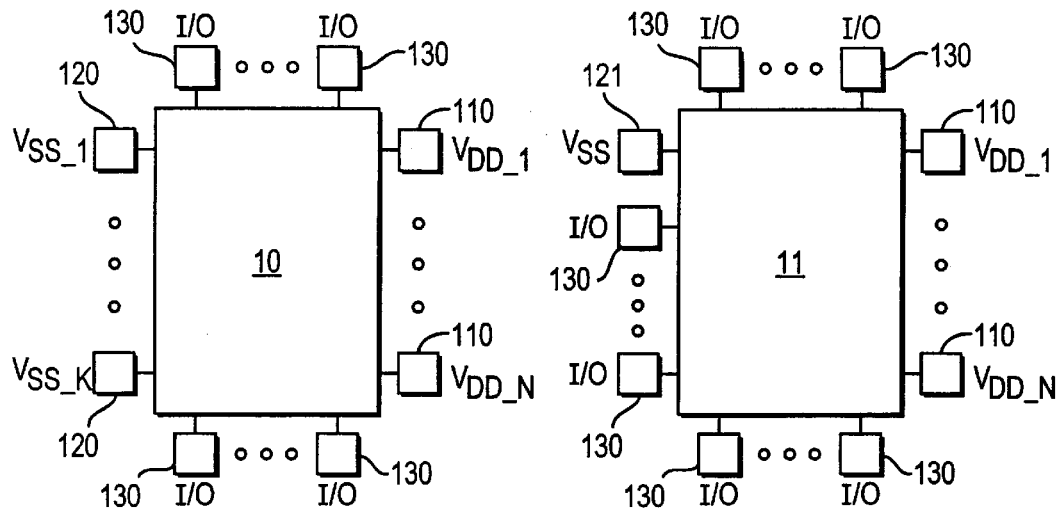
FIG. 1 is a simplified block diagram of a representative integrated circuit device that may be improved in accordance with the principles of the present invention.
FIG. 2 is a simplified block diagram of an alternative embodiment of the device of FIG. 1.

FIG. 1 is a simplified block diagram of a representative integrated circuit device 10 that may be improved in accordance with the principles of the present invention. Device 10 is representative of a variety of integrated circuit devices that may be powered by several power supplies ($V_{DD\_1} \ldots V_{DD\_N}$) provided on power pads 110. Device 10 may also have several grounds ($V_{SS\_1} \ldots V_{SS\_K}$) provided on ground pads 120, which may or may not correspond to the number of power pads 110. Alternatively, device 10 may have a single ground or a set of shorted grounds. This alternative embodiment of device 10 is represented in FIG. 2 as device 11, which has a single ground pad 121, which may be used to provide $V_{SS}$.

As the number of power and/or ground buses increases on device 10/11, achieving adequate ESD protection using conventional ESD protection schemes becomes more difficult: conventional techniques that involve the exhaustive cross-clamping of each combination of power and/or ground buses may lead to undesirably large increases in chip area as the number of power and/or ground buses increases. Similarly, the area overhead and I/O capacitance associated with conventional I/O protection techniques (e.g., using large I/O transistors and/or providing a complex ESD protection circuit between each I/O pad and each power and/or ground bus) may severely limit the number of power and/or ground buses that may be realistically used in a design.

Figure 3:
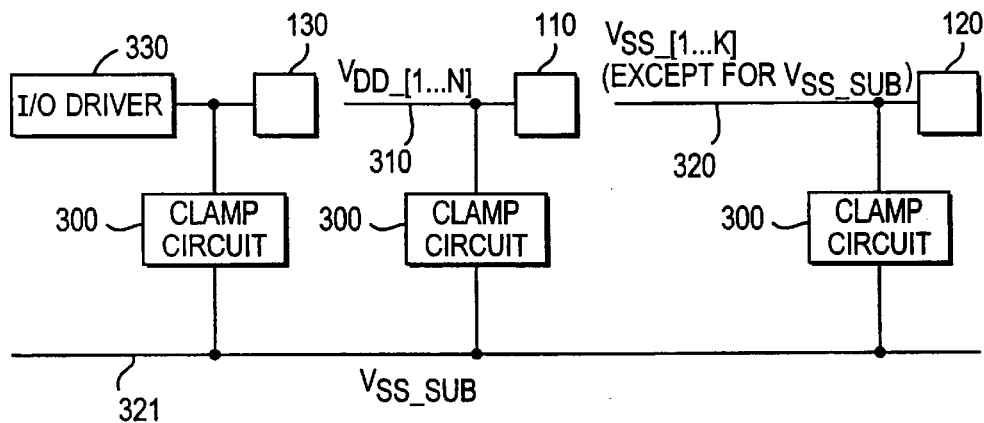
FIG. 3 is a simplified block diagram that provides an overview of how the principles of the present invention may be applied to the device of FIG. 1.
Figure 4:
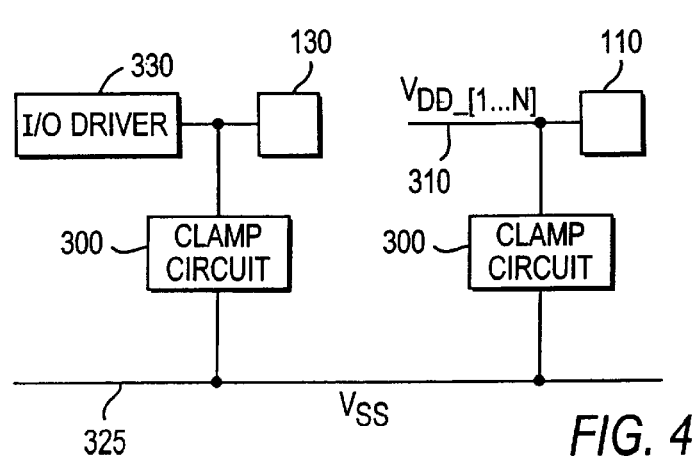
FIG. 4 is a simplified block diagram that provides an overview of how the principles of the present invention may be applied to the device of FIG. 2.

The present invention provides a technique for protecting device 10/11 against ESD damage that presents minimal impact on chip area and I/O capacitance as the number of power buses, ground buses, and I/O pads is increased. FIG. 3 illustrates how this technique may be applied in devices 10 having multiple ground buses 320. As shown in FIG. 3, a clamp circuit 300 that is capable of handling both positive and negative ESD pulses is used to clamp each power bus 310, ground bus 320, and I/O pad 130 within device 10 to a respective one of the ground buses 321. In one embodiment of the invention, ground bus 321 is the ground bus that is tied to the substrate (i.e., during operation of device 10, ground bus 321 may be used to bias the substrate to some biasing voltage, $V_{SS\_SUB}$). Similarly, FIG. 4 illustrates how the technique may be applied in devices 11 that have a single ground bus 325 (or multiple ground buses that have all been shorted together). Merely for the purpose of illustrating the principles of the present invention, one of the embodiments of the invention that will be described in detail herein will be that in which the ground bus to which the power buses, ground buses (if there is more than one ground bus), and I/O pads are clamped is the ground bus 321 to which the substrate (and, in some cases, the core circuitry) is tied. The choice of this "clamp bus", which is the ground bus to which all the clamp circuits 300 are connected, may vary according to, among other things, the semiconductor process used and/or the types of circuit blocks that are included in device 10/11.

For the purposes of the present invention, the I/O driver 330 that is connected to the I/O pad 130, as shown in FIGS. 3 and 4, may be any of a variety of I/O drivers: input drivers, output drivers, bi-directional drivers, tristate drivers, etc. Depending on the application, some or all of these I/O structures may be ESD-hardened using suitable ESD-hardening techniques (e.g., increasing the gate-contact spacings, blocking silicide deposition, thickening the gate-oxide layer, etc.). In some embodiments of the invention, the I/O pads 130 that are connected to output drivers (or the output driver portions of bi-directional drivers) may not need to be clamped to the clamp bus using clamp circuit 300 if the structures within the output driver are capable of functioning as clamp circuit 300 during an ESD event.

As previously mentioned, clamp circuit 300 is capable of handling both positive and negative ESD pulses. In one embodiment of the invention, clamp circuit 300 may be a stacked NMOS device 500, such as the one shown in FIG. 5, in which a pair of NMOS transistors 501/502 (which may be ESD-hardened using any suitable ESD-hardening technique) are connected in the following clamping arrangement: the drain 511 of NMOS transistor 501 and the gate 522 of NMOS transistor 502 are connected to an associated I/O pad 130, power bus 310, or ground bus 320 (if there are multiple ground buses); the source terminals 513/523 are connected to the clamp bus, which, in the embodiment shown in FIG. 5, is the ground bus 321/325 that is tied to the substrate ($V_{SS\_SUB}$ for device 10; $V_{SS}$ for device 11); and the drain 521 of NMOS transistor 502 is connected to the gate 512 of NMOS transistor 501.

During normal operation of device 10/11, the potential differences that may exist between the I/O pads, power buses, and ground buses may not be high enough to cause stacked NMOS device 500 to "turn-on" and act as a low impedance conduction path between its associated clamped nodes (e.g., I/O pad-to-substrate ground bus, power bus-to-substrate ground bus, other ground bus-to-substrate ground bus). However, during an ESD event, the potential difference (typically several hundreds or thousands of volts) across stacked NMOS device 500 may be high enough to cause stacked NMOS device 500 to enter an operating mode that creates a low impedance ESD discharge path between its clamped nodes. For the purposes of the present invention, the mechanism by which the discharge path is created within a clamp circuit 300, such as stacked NMOS device 500, may be different for different ESD pulse polarities.

In the embodiment of stacked NMOS device 500 shown in FIG. 5, for example, the behavior of stacked NMOS device 500 during a negative ESD event may be different from its behavior during a positive ESD event. During a negative ESD event, in which the potential of the associated I/O pad 130, power bus 310, or ground bus 320 (if there are multiple ground buses) is negative with respect to the potential of the clamp bus 321/325, neither NMOS transistor 501/502 turns on. However, the substrate-to-drain junction of NMOS transistor 501 becomes forward-biased, thereby causing the voltage on the associated I/O pad 130, power bus 310, or ground bus 320 (if there are multiple ground buses) to be clamped to a holding voltage that is approximately the built-in potential of the diode formed by the substrate-to-drain junction. Accordingly, when stacked NMOS device 500 is subjected to a negative ESD pulse, NMOS transistors 501/502 may effectively function as the equivalent circuit shown in FIG. 6, which illustrates that a low impedance conduction path between the clamped nodes may be formed when the diode formed by the substrate-to-drain junction of NMOS transistor 501 becomes forward-biased.

During a positive ESD event, in which the potential of the associated I/O pad 130, power bus 310, or ground bus 320 (if there are multiple ground buses) is positive with respect to the potential of the clamp bus 321/325, the potential difference between the drain 511 and the source 513 of NMOS transistor 501 may become high enough to cause "snap-back" to occur within NMOS transistor 501 such that the ESD current may be shunted to the substrate ground bus 321/325 through a low impedance path formed by NMOS transistor 501. In addition, NMOS transistor 502 turns on during the positive ESD event to provide a soft ground for the gate 512 of NMOS transistor 501. Before NMOS transistor 502 actually turns on, however, the rising voltage on the drain 511 of NMOS transistor 501 may be capacitively coupled to its associated gate 512, thereby causing NMOS transistor 501 to temporarily enter a weak turn-on state. (This weak turn-on of NMOS transistor 501 may help generate substrate current for triggering snap-back.) As soon as NMOS transistor 502 turns on, the gate potential of NMOS transistor 501 becomes low, thereby preventing the channel of NMOS transistor 501 from turning on too hard (otherwise, NMOS transistor 501 may be damaged). Accordingly, when stacked NMOS device 500 is subjected to a positive ESD pulse, NMOS transistors 501/502 may effectively function as the circuit illustrated in FIG. 7.

As shown in FIG. 7, the discharge path between the clamped nodes is formed through NMOS transistor 501 when "snap-back" occurs. The "snap-back" phenomenon, which arises from the parasitic bipolar action within an MOS device, occurs in several steps: during an ESD event, the potential difference across NMOS transistor 501 becomes high enough to cause its drain-to-substrate junction to breakdown, which gives rise to a substrate current. Because the substrate has resistance, the substrate current raises the substrate voltage. When the source-to-substrate junction becomes forward-biased as a result of the rising substrate voltage, the parasitic bipolar turns on, and a low-impedance discharge path for the ESD current is created from the drain 511 through the substrate to the source 513 of NMOS transistor 501, thereby allowing the drain-to-source potential difference to "snap back" to a voltage that is lower than the voltage that triggered the drain-to-substrate junction breakdown. In the present embodiment of stacked NMOS device 500, the initial junction breakdown associated with snap-back occurs at the drain-to-substrate junction of NMOS transistor 501; accordingly, the spacing between the source contact and the gate of NMOS transistor 501 may be minimized.

One of the advantages of snap-back is that it is a non-destructive mode of transistor breakdown during an ESD event that allows the holding voltage of the clamp circuit to be much lower than the junction breakdown voltage. In conventional ESD protection techniques that rely on reverse-biased diodes for clamping voltages, junction breakdown may be the primary mechanism that shunts the ESD current to ground. During junction breakdown, the holding voltage of the ESD protection device may be clamped at the junction breakdown voltage, which may be high enough to result in excessively-high power dissipation (the ESD current is also high) such that device reliability may be adversely affected. In some cases, the heat generated during junction breakdown may be sufficient to cause parts of device 10/11 to melt. By lowering the holding voltage, the snap-back phenomenon allows the ESD current to be shunted to ground without dissipating as much power as during junction breakdown.

From the foregoing discussion, the mechanism that allows stacked NMOS device 500 to provide a low impedance discharge path may be summarized as follows: when stacked NMOS device 500 is subjected to a positive ESD pulse, in which a positive potential difference exists across NMOS transistor 501, the ESD current is discharged to the ground bus 321/325 through a low impedance path when snap-back occurs in NMOS transistor 501. Conversely, when stacked NMOS device 500 is subjected to a negative ESD pulse, in which a negative potential difference exists across NMOS transistor 501, a low impedance conduction path for the ESD pulse is created when the drain-to-substrate junction of NMOS transistor 501 becomes forward-biased. Based on these two operating modes of stacked NMOS device 500, it is possible to provide an ESD discharge path between any combination of I/O pads 130, power buses 310, or ground buses 320 (if there are multiple ground buses) via the clamp bus, which in the presently-discussed embodiment is ground bus 321/325 (the various terminal combinations to which an ESD pulse may be applied include, for example: I/O pad-I/O pad, I/O pad-power bus, I/O pad-ground bus, power bus-power bus, power bus-ground bus, ground bus-ground bus, etc.)

For example, in the case where an ESD pulse is applied between an I/O pad 130 and a power bus 310, where the potential applied to the I/O pad 130 is positive with respect to the power bus 310, the ESD current may be discharged as a result of snap-back occurring in the NMOS transistor 501 in the stacked NMOS device 500 associated with the I/O pad 130, and the forward-biasing of the drain-to-substrate junction of the NMOS transistor 501 in the stacked NMOS device 500 associated with the power bus 310. In discharging the ESD current from the I/O pad 130 to the power bus 310, the occurrence of the positive and negative ESD protection modes in the stacked NMOS devices 500 associated with the I/O pad 130 and the power bus 310, respectively, is based on the respective potential differences between each clamped terminal and the ground bus 321/325. Specifically, the stacked NMOS device 500 that clamps the I/O pad 130 to the ground bus 321/325 (the clamp bus) is effectively being subjected to a positive ESD event; thus, snap-back occurs in the stacked NMOS device 500 associated with the I/O pad 130. Similarly, the stacked NMOS device 500 that clamps the power bus 310 to the ground bus 321/325 is effectively being subjected to a negative ESD event; thus, a conduction path for the ESD current is created upon the forward-biasing of the drain-to-substrate junction of the NMOS transistor 501 in the stacked NMOS device 500 associated with the power bus 310. Thus, an ESD discharge path may be created between the I/O pad 130 and the power bus 310 through ground bus 321/325.

As discussed in the foregoing, and as illustrated in FIGS. 6 and 7, the mechanism by which a low impedance discharge path is created within stacked NMOS device 500 during an ESD event may differ according to the polarity of the potential difference to which it is subjected. In accordance with the principles of the present invention, other clamp circuit embodiments may be used in which the mechanism for creating a low impedance discharge path is independent of polarity. Moreover, any other clamp circuit 300 may be used that is capable of effectively discharging an ESD pulse regardless of polarity, and is small enough to be replicated many times throughout device 10/11 with minimal impact on chip area. For those embodiments of device 10/11 in which the junction breakdown voltage is high enough to result in undesirably high power dissipation during an ESD event, any implementation of clamp circuit 300 that also has a holding voltage that is lower than the junction breakdown voltage may be suitable for the purposes of the present invention.

In some implementations of the invention, it may not be necessary to clamp I/O pads 130 that are connected to output drivers (or I/O structures that have output driver portions) if the structures within each output driver can effectively function during an ESD event as a clamping circuit that is suitable for the purposes of the present invention. For example, in some output driver embodiments, if the pull-down transistor that drives the I/O pad is configured such that its source terminal is not floating with respect to the substrate, that pull-down transistor may be capable of behaving like NMOS transistor 501 in stacked NMOS device 500 during an ESD event, thereby obviating the need to clamp the I/O pad associated with that pull-down transistor. This scenario may be illustrated by comparing the output driver 830 shown in FIG. 8, which may require a clamp circuit 300, with the output drivers 930 and 1030 shown in FIGS. 9 and 10, respectively, which may not need to be clamped.

FIG. 8 shows an output driver 830 coupled to an I/O ground bus ($V_{SS\_I/O}$) 320 that is separate from the substrate ground bus ($V_{SS\_SUB}$) 321, which is the clamp bus of the embodiment shown in FIG. 8. Because the source terminal 843 of I/O pull-down transistor 840 is floating with respect to the substrate, snap-back may not occur in I/O pull-down transistor 840 during a positive ESD discharge from I/O pad 130 to the substrate ground. As a result, without stacked NMOS device 500 to provide a low impedance discharge path, via snap-back, between I/O pad 130 and the substrate ground bus 321 during a positive ESD event, I/O pull-down transistor 840 may discharge the ESD current to the substrate via junction breakdown, which may result in undesirably high power dissipation.

Figure 9:
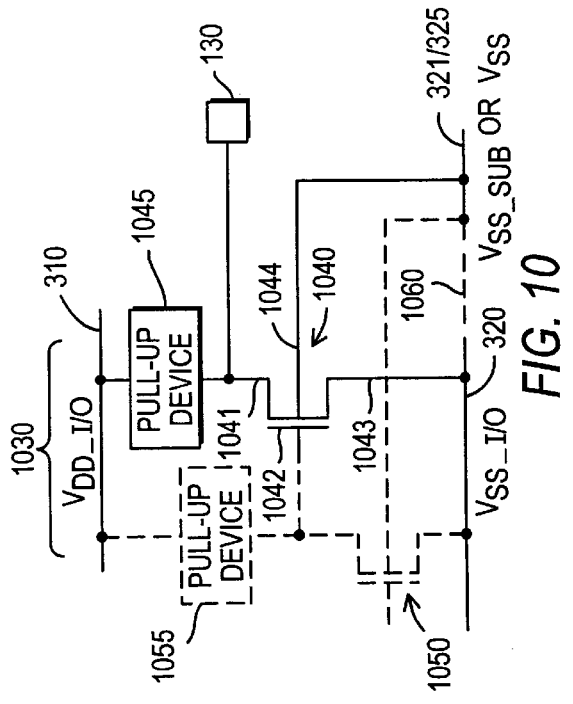
FIG. 9 is a simplified illustration of an aspect of the invention as applied to an alternative embodiment of the output driver of FIG. 8.
Figure 10:
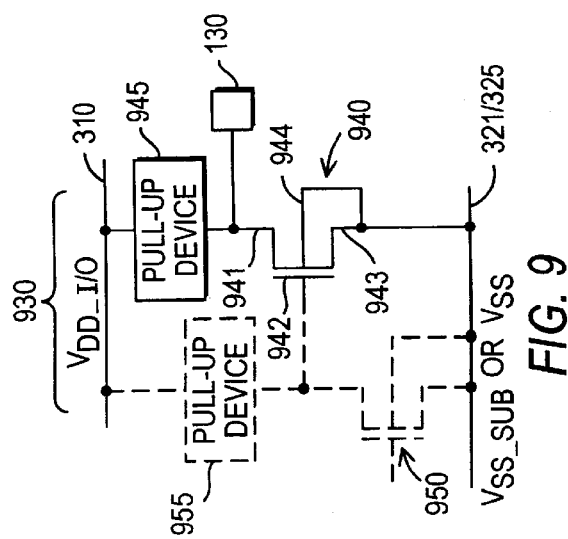
FIG. 10 is a simplified illustration of an aspect of the invention as applied to another alternative embodiment of the output driver of FIG. 8.

In contrast, the output driver 930 shown in FIG. 9 is configured such that the source 943 of the I/O pull-down transistor 940 that drives I/O pad 130 is coupled to the substrate ground 321/325, thereby allowing snap-back to occur in pull-down transistor 940 during a positive ESD event. Accordingly, when I/O pad 130 is subjected to a positive ESD pulse, I/O pull-down transistor 940 may discharge the ESD current to the substrate ground bus 321/325 in a manner similar to NMOS transistor 501 in stacked NMOS device 500. When I/O pad 130 is subjected to a negative ESD pulse, the diode formed by the substrate-to-drain junction of I/O pull-down transistor 940 may become forward-biased, thereby allowing the voltage on the I/O pad 130 to be clamped to approximately the built-in potential of the junction. It may be discerned in FIG. 9 that I/O pull-down transistor 940 and its associated driver transistor 950 (shown in dotted lines) that drives its gate 942 resemble the configuration of NMOS transistors 501/502 in stacked NMOS device 500. The principles of the invention illustrated in FIG. 9 that obviates the need for a clamp circuit 300 may also apply to other embodiments of output drivers, such as output driver 1030 shown in FIG. 10, in which the source 1043 of the pull-down transistor 1040 is connected to a ground bus (e.g., $V_{SS\_I/O}$) 320 that has been shorted to the substrate ground bus 321/325. (The shorting of the ground buses is indicated by dotted line 1060. In some embodiments, the shorting may occur in the package that houses the device.) In accordance with the principles of the present invention, a clamp circuit 300 may therefore not be necessary for an I/O pad 130 that is connected to an I/O driver that is configured in a manner that is similar to those shown in FIGS. 9 and 10.

The principles of the present invention may be readily applied to current designs because it minimizes the number and the complexity of ESD protection devices by using an existing ground bus (e.g., a substrate ground bus that provides $V_{SS\_SUB}$ or $V_{SS}$) as a clamp bus that provides a discharge path for any and all ESD pulses, regardless of polarity. For example, in the embodiment of the invention described herein in which the substrate ground bus is the clamp bus, the substrate ground bus is effectively a multi-purpose ground bus that may be used as an ESD current path when the device 10/11 is turned off and as an electrical ground that biases the substrate when the device 10/11 is turned on.

Figure 11:
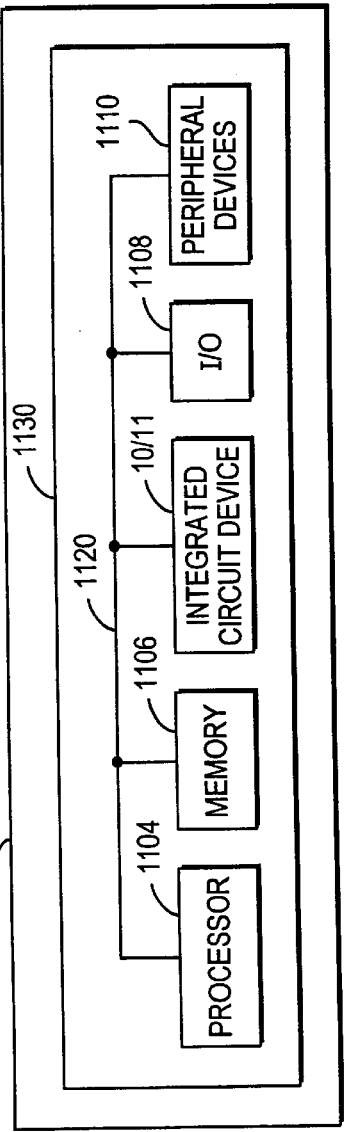
FIG. 11 is a simplified block diagram of an illustrative system employing an integrated circuit device that has been improved in accordance with the principles of the present invention.

FIG. 11 shows how an integrated circuit device 10/11 employing the improved technique for providing ESD protection may be used in a system 1100. System 1100 can be used in a wide variety of applications, such as computer networking, data networking, instrumentation, video processing, digital signal processing, or any other application where the advantage of using programmable or reprogrammable logic is desirable. Integrated circuit device 10/11, employing the improved technique for providing ESD protection in accordance with the principles of the present invention, may be used to perform a variety of different logic functions. For example, integrated circuit device 10/11 can be configured as a processor or controller that works in cooperation with processor 1104. Integrated circuit device 10/11 may also be used as an arbiter for arbitrating access to a shared resource in system 1100. In yet another example, integrated circuit device 10/11 may be configured as an interface between processor 1104 and one of the other components in system 1100.

Various technologies may be used to implement the integrated circuit device 10/11 employing the improved technique for providing ESD protection according to this invention. Moreover, this invention is applicable to both one-time-only programmable and reprogrammable devices.

Thus, it is seen that an improved technique for providing ESD protection of an integrated circuit device has been presented. One skilled in the art will appreciate that the present invention may be practiced by other than the described embodiments, which are presented for purposes of illustration and not of limitation, and the present invention is limited only by the claims which follow.

What is claimed is:

1. An integrated circuit device comprising:
   a plurality of circuit blocks connected to a plurality of power buses;
   a plurality of existing ground buses internal to the integrated circuit device configured to provide a plurality of electrical grounds for the plurality of circuit blocks, wherein one of the existing ground buses internal to the integrated circuit device is a multi-purpose clamp bus; and
   a plurality of clamp circuits, wherein each power bus is connected to the clamp bus through a respective one of the clamp circuits associated with that power bus, and each existing ground bus other than the clamp bus is connected to the clamp bus through a respective one of the clamp circuits associated with that existing ground bus.

2. The device defined in claim 1, further comprising:
   a plurality of input/output pads, wherein each input/output pad in the plurality of input/output pads is connected to the clamp bus through a respective one of the clamp circuits associated with that input/output pad.

3. The device defined in claim 1, wherein the device is fabricated on a substrate, and wherein the clamp bus is connected to the substrate.

4. The device defined in claim 3, wherein each clamp circuit includes a first NMOS transistor having a first drain, a first source, a first gate, an d a first substrate connection.

5. The device defined in claim 4, wherein the first NMOS transistor has a junction breakdown voltage, and wherein the clamp circuit is configured to maintain a holding voltage during an electrostatic discharge event that is lower than the junction breakdown voltage of the first NMOS transistor.

6. The device defined in claim 4, wherein the clamp circuit is configurable for operation in a plurality of operating modes, wherein in a first operating mode, a first discharge path is created when snap-back occurs in the first NMOS transistor.

7. The device defined in claim 6, wherein the first drain of the first NMOS transistor and the substrate forms a diode, and wherein in a second operating mode, a second discharge path is created when the diode formed by the first drain of the first NMOS transistor and the substrate becomes forward-biased.

8. The device defined in claim 4, wherein each clamp circuit further includes a second NMOS transistor having a second drain, a second source, a second gate, and a second substrate connection, wherein the second drain of the second NMOS transistor is connected to the first gate of the first NMOS transistor, and wherein the second NMOS transistor is configured to ground the first gate of the first NMOS transistor during the first operating mode.

9. A digital processing system comprising:
   processing circuitry;
   a system memory coupled to said processing circuitry; and
   the device defined in claim 1 coupled to the processing circuitry and the system memory, wherein the device is a programmable logic device.

10. A printed circuit board on which is mounted the device defined in claim 1, wherein the device is a programmable logic device.

11. The printed circuit board defined in claim 10 further comprising:
    a board memory mounted on the printed circuit board and coupled to the programmable logic device.

12. The printed circuit board defined in claim 11 further comprising:
    processing circuitry mounted on the printed circuit board and coupled to the programmable logic device.

13. For use on an integrated circuit device fabricated on a substrate and having a plurality of power buses and a plurality of existing ground buses internal to the integrated circuit device, a method for providing electrostatic discharge protection, comprising:
    configuring a respective one of the plurality of existing ground buses internal to the integrated circuit device as a multi-purpose ground bus;
    providing a plurality of clamp circuits; and clamping each power bus to the multi-purpose ground bus through a respective one of the clamp circuits associated with that power bus, and further clamping each existing ground bus other than the multi-purpose ground bus to the multi-purpose ground bus through a respective one of the clamp circuits associated with that existing ground bus.

14. The method defined in claim 13, further comprising:
    configuring the multi-purpose ground bus to provide a substrate bias voltage to the substrate when the device is powered on, and further configuring the multi-purpose ground bus to provide a discharge path for an electrostatic discharge pulse when the device is powered off.

15. The method defined in claim 13, further comprising:
configuring each clamp circuit to provide a first discharge path to the multi-purpose ground bus during a positive electrostatic discharge event, and a second discharge path to the multi-purpose ground bus during a negative electrostatic discharge event.

16. The method defined in claim 15, further comprising:
providing an MOS transistor within each clamp circuit; and
configuring the MOS transistor to operate in at least two modes, wherein in a first mode, the NMOS transistor is configured to provide the first discharge path and in a second mode, the MOS transistor is configured to provide the second discharge path.

17. The method defined in claim 15, further comprising:
configuring the plurality of clamp circuits and the multi-purpose ground bus to provide a third discharge path through at least two clamp circuits, wherein the third discharge path is created by a combination of the first discharge path provided by a first clamp circuit and the second discharge path provided by a second clamp circuit.

18. An integrated circuit device comprising:
a plurality of circuit blocks connected to a plurality of power buses;
a plurality of input/output pads;
an existing ground bus internal to the integrated circuit device configured as a multi-purpose ground bus; and
a plurality of clamp circuits, wherein each power bus is connected to the existing ground bus internal to the integrated circuit device through a respective one of the clamp circuits associated with that power bus, and wherein a subplurality of the input/output pads within the plurality of input/output pads are connected to the existing ground bus internal to the integrated circuit device through the clamp circuits associated with the subplurality of input/output pads.

19. The device defined in claim 18, further comprising:
a plurality of driver circuits, each driver circuit being connected to a respective one of the input/output pads in the plurality of input/output pads, wherein a subset of the driver circuits are not connected to the subplurality of input/output pads, and wherein each driver circuit in the subset includes structures similar to the clamp circuit.

20. A digital processing system comprising:
processing circuitry;
a system memory coupled to said processing circuitry; and
the device defined in claim 18 coupled to the processing circuitry and the system memory, wherein the device is a programmable logic device.

21. A printed circuit board on which is mounted the device defined in claim 18, wherein the device is a programmable logic device.

22. The printed circuit board defined in claim 21 further comprising:
a board memory mounted on the printed circuit board and coupled to the programmable logic device.

23. The printed circuit board defined in claim 22 further comprising:
processing circuitry mounted on the printed circuit board and coupled to the programmable logic device.

* * * * *